United States Patent [19]

Kawahara et al.

[11] Patent Number: 5,739,674
[45] Date of Patent: Apr. 14, 1998

[54] METHOD OF TRANSMITTING AND RECEIVING SIGNAL INDICATIVE OF REMAINING CAPACITY OF STORAGE BATTERY FOR PROPELLING ELECTRIC VEHICLE

[75] Inventors: Naohisa Kawahara; Tomoaki Nakai; Yoshikazu Imura; Makoto Kondo, all of Wako, Japan

[73] Assignee: Honda Giken Kogyo Kabushiki Kaisha, Tokyo, Japan

[21] Appl. No.: 729,874

[22] Filed: Oct. 15, 1996

[30] Foreign Application Priority Data

Oct. 16, 1995 [JP] Japan ............................ 7-267432

[51] Int. Cl.⁶ .................... H01M 10/44; H07J 7/04
[52] U.S. Cl. ...................... 320/48; 320/2; 324/426
[58] Field of Search ................... 320/2, 48; 307/10.2, 307/10.7; 180/277; 340/455, 825.31, 825.76; 324/426–430

[56] References Cited

U.S. PATENT DOCUMENTS

| | | | |
|---|---|---|---|
| 3,594,628 | 7/1971 | Gutzmer et al. | 320/13 |
| 4,734,858 | 3/1988 | Schlafly | 364/408 |
| 5,521,443 | 5/1996 | Imura et al. | 307/10.2 |
| 5,583,819 | 12/1996 | Roesner et al. | 365/225.7 |
| 5,595,064 | 1/1997 | Ikeda et al. | 62/126 |
| 5,596,261 | 1/1997 | Suyama | 320/48 |
| 5,608,324 | 3/1997 | Yoshida | 324/426 |

FOREIGN PATENT DOCUMENTS

5211724  8/1993  Japan.

OTHER PUBLICATIONS

English language Abstract of JP 5–211724.

*Primary Examiner*—Peter S. Wong
*Assistant Examiner*—Gregory J. Toatley, Jr.
*Attorney, Agent, or Firm*—Lyon & Lyon LLP

[57] ABSTRACT

A signal indicative of the remaining capacity of a storage battery for propelling an electric vehicle is transmitted and received between a portable control unit and a communication unit on the electric vehicle. A display request signal for displaying the remaining capacity of the storage battery is transmitted from the portable control unit which has a plurality of indicator lamps corresponding to respective ranges of a rated capacity of the storage battery, to the communication unit. When the display request signal is received by the communication unit, one of the ranges to which the remaining capacity of the storage battery belongs is determined by the communication unit, and a remaining capacity display signal representing the determined range is transmitted from the communication unit to the portable control unit. The remaining capacity display signal is received by the portable control unit, and one of the indicator lamps which corresponds to the range to which the remaining capacity of the storage battery belongs is turned on based on the received remaining capacity display signal for a predetermined period of time.

17 Claims, 12 Drawing Sheets

FIG. 4A

| SYNC | ID1 | ID2 | ID3 | ID4 | FLAG | ERROR-CORRECTING DATA |
|------|-----|-----|-----|-----|------|----------------------|

FLAG expanded:

| FLAG FOR INDICATING STARTING OF AIR-CONDITIONING UNIT | FLAG FOR INDICATING SHUTDOWN OF AIR-CONDITIONING UNIT | FLAG FOR INDICATING LOCKING OF DOORS | FLAG FOR INDICATING UNLOCKING OF DOORS | FLAG FOR INDICATING REQUEST "1" | FLAG FOR INDICATING REQUEST "2" | SPARE BIT | SPARE BIT |
|---|---|---|---|---|---|---|---|

FIG. 4B

| SYNC | ID1 | ID2 | ID3 | ID4 | FLAG | ERROR-CORRECTING DATA |
|------|-----|-----|-----|-----|------|----------------------|

FLAG expanded:

| FLAG FOR INDICATING OPERATION OF AIR-CONDITIONING UNIT | FLAG F | FLAG M | FLAG E | BLINK FLAG | SPARE BIT | SPARE BIT | SPARE BIT |
|---|---|---|---|---|---|---|---|

FIG. 11

| REMAINING CAPACITY / INDICATOR LAMP | 80 % OR MORE OF RATED CAPACITY | LESS THAN 80 % OF AND 20 % OR MORE OF RATED CAPACITY | LESS THAN 20 % OF RATED CAPACITY |
|---|---|---|---|
| 20-1 | ON | — | — |
| 20-2 | — | ON | — |
| 20-3 | — | — | ON |

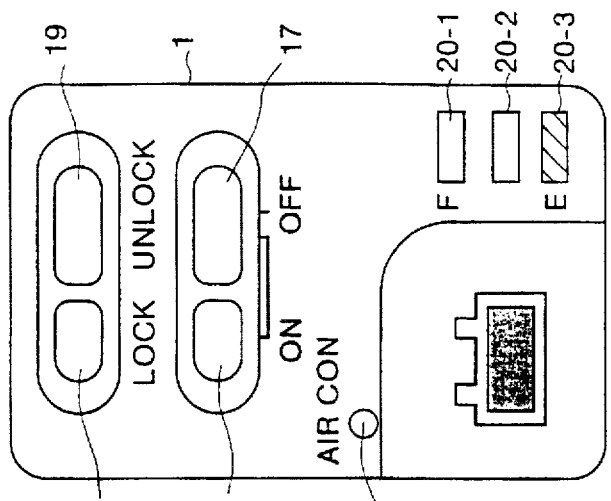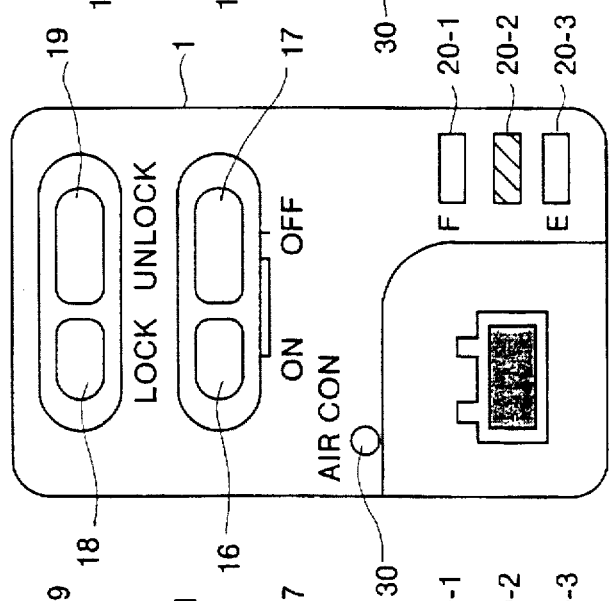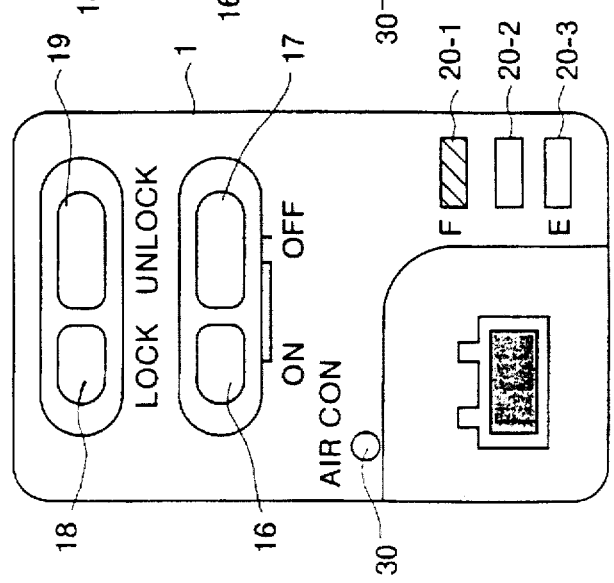

METHOD OF TRANSMITTING AND RECEIVING SIGNAL INDICATIVE OF REMAINING CAPACITY OF STORAGE BATTERY FOR PROPELLING ELECTRIC VEHICLE

BACKGROUND OF THE INVENTION

1. Field of the Invention

The present invention relates to a method of transmitting and receiving a signal indicative of the remaining capacity of a storage battery for propelling an electric vehicle while displaying the remaining capacity of the storage battery on a portable control unit based on communications between the portable control unit and a communication unit on the electric vehicle.

2. Description of the Related Art

Heretofore, a portable control unit for use with an electric vehicle has at least a keyswitch for turning on and off an air-conditioning unit on the electric vehicle and a display unit. The keyswitch can turn on and off the air-conditioning unit based on communications between the portable control unit and a communication unit on the electric vehicle. The display unit can display various values including the temperature of a passenger's compartment of the electric vehicle, the temperature setting for the passenger's compartment, the remaining capacity of the storage battery which stores electric energy for propelling the electric vehicle, and the time scheduled for charging the storage battery. The various values are displayed on the display unit based on signals received by the portable control unit through data communications between the portable control unit and the communication unit. One example of such a portable control unit is disclosed in Japanese laid-open patent publication No. 52-11724.

The display unit for displaying the above various values comprises a liquid crystal display unit, for example, and the signals are received by the portable control unit through data communications between the portable control unit and the communication unit. The amount of communication data supplied to the portable control unit for display is relatively large, and the portable control unit is relatively large in size as it is required to identify and individually display different items of information representative of the various values transmitted from the electric vehicle.

SUMMARY OF THE INVENTION

It is a major object of the present invention to provide a method of transmitting and receiving a signal indicative of the remaining capacity of a storage battery for propelling an electric vehicle, through a relatively short period of time which is required for a signal exchange between a portable control unit and a communication unit on the electric vehicle.

Another object of the present invention is to provide a method of transmitting and receiving a signal indicative of the remaining capacity of a storage battery for propelling an electric vehicle, using a portable control unit which is relatively small in size.

Still another object of the present invention is to provide a method of transmitting and receiving a signal indicative of the remaining capacity of a storage battery for propelling an electric vehicle, using a portable control unit which has a reduced number of remote control means for controlling devices on the electric vehicle.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 4A is a diagram showing a format of transmission data from the portable control unit;

FIG. 4B is a diagram showing a format of transmission data from the communication unit;

FIG. 11 is a diagram showing the relationship between indicator lamps on the portable control unit and values of the remaining capacity of the storage battery;

FIG. 12A is a front elevational view of the portable control unit, showing how indicator lamps are turned on when the remaining capacity of the storage battery is 80% or more of the rated capacity of the storage battery;

FIG. 12B is a front elevational view of the portable control unit, showing how indicator lamps are turned on when the remaining capacity of the storage battery is less than 80% of and 20% or more of the rated capacity of the storage battery; and FIG. 12C is a front elevational view of the portable control unit, showing how indicator lamps are turned on when the remaining capacity of the storage battery is less than 20% of the rated capacity of the storage battery.

DETAILED DESCRIPTION OF THE PREFERRED EMBODIMENT

Figure 1:
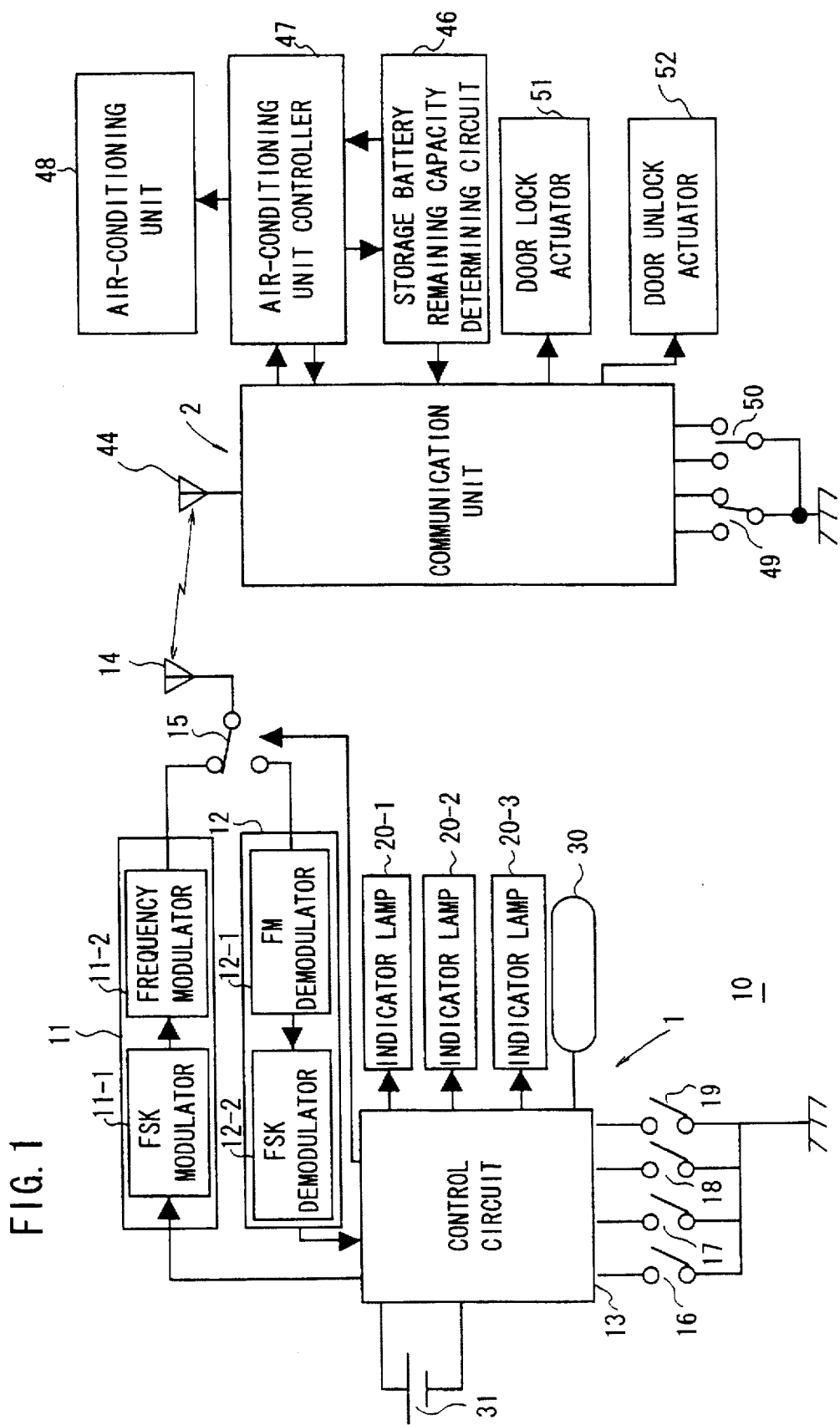
FIG. 1 is a block diagram of an apparatus for carrying out a method of transmitting and receiving a signal indicative of the remaining capacity of a storage battery for propelling an electric vehicle, the view showing a portable control unit in detail.
Figure 2:
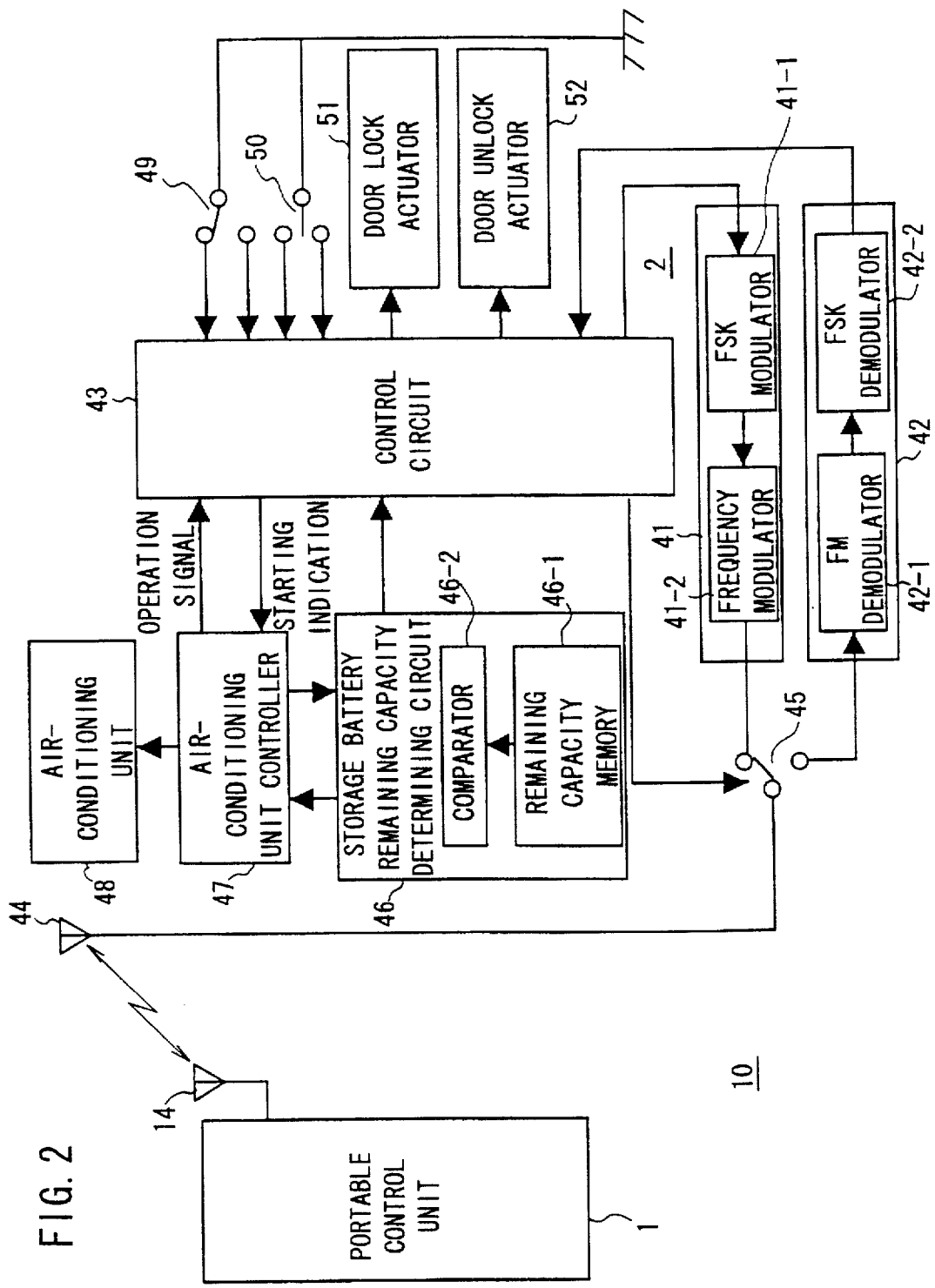
FIG. 2 is a block diagram of the apparatus shown in FIG. 1, the view showing a communication unit on the electric vehicle in detail.

FIGS. 1 and 2 show in block form an apparatus 10 for carrying out a method of transmitting and receiving a signal indicative of the remaining capacity of a storage battery for propelling an electric vehicle.

As shown in FIGS. 1 and 2, the apparatus 10 generally comprises a portable control unit 1 for effecting remote control operation and a communication unit 2 mounted on an electric vehicle.

As shown in FIG. 1, the portable control unit 1 comprises a transmission circuit 11 having an FSK (frequency-shift keying) modulator 11-1 and a frequency modulator 11-2, a reception circuit 12 having an FM demodulator 12-1 and an FSK demodulator 12-2, a control circuit 13, and an antenna switch 15 for selectively applying an output signal from the transmission circuit 11 to an antenna 14 and applying an output signal from the antenna 14 to the reception circuit 12 under the control of the control circuit 13.

Figure 3:
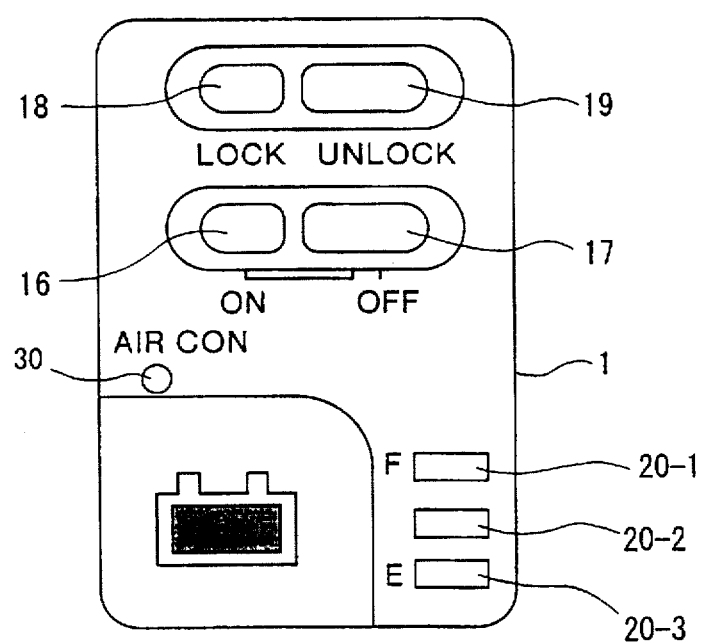
FIG. 3 is a front elevational view of the portable control unit shown in FIGS. 1 and 2.

As also shown in FIG. 3, the portable control unit 1 also has a keyswitch 16 which can independently be turned on for indicating a request to indicate the remaining capacity of a storage battery which stores electric energy for propelling an electric vehicle, a keyswitch 17 which can be turned on substantially simultaneously with the keyswitch 16 for turning on a passenger's compartment air-conditioning unit 48 on the electric vehicle and can independently be turned on for turning off the air-conditioning unit 48, a keyswitch 18 which can be turned on for indicating the locking of doors of the electric vehicle, a keyswitch 19 which can be turned on for indicating the unlocking of doors of the electric vehicle, a plurality of indicator lamps 20-1, 20-2, 20-3, each comprising a light-emitting diode, which can be turned on and off by an output signal from the control circuit 13 in response to an output signal from the communication unit 2 through the reception circuit 12, for indicating the remaining capacity of the storage battery, an indicator lamp 30 comprising a light-emitting diode for indicating that the air-conditioning unit 48 is in operation, and a lithium cell 31 for supplying electric energy to the portable control unit 1. The indicator lamps 20-1, 20-2, 20-3 serve to indicate respective predetermined ranges of the rated capacity of the storage battery to which the remaining capacity of the storage battery belongs.

When at least one of the keyswitches 16~19 is pressed, the control circuit 13 carries out a predetermined process, and thereafter shifts the antenna switch 15 to the transmission circuit 11 and controls the transmission circuit 11 to FSK-modulate the data of a format having information produced by the pressed keyswitch with the FSK modulator 11-1 and transmit an FM wave which has been frequency modulated by the frequency modulator 11-2. After the FM wave has been transmitted, the control circuit 13 shifts the antenna switch 15 to the reception circuit 12. The reception circuit 12 now receives a radio wave transmitted from the communication unit 2. A signal based on the received radio wave is then FM-demodulated by the FM demodulator 12-1, and FSK-demodulated by the FSK demodulator 12-2. Based on the FSK-demodulated output signal from the FSK demodulator 12-2, for example if key switch 16 had been pressed the control circuit 13 determines and latches a signal indicative of the remaining capacity of the storage battery, and selectively turns on the indicator lamps 20-1, 20-2, 20-3 for a predetermined period of time based on the latched signal.

As shown in FIG. 2, the communication unit 2 comprises a transmission circuit 41 having an FSK modulator 41-1 and a frequency modulator 41-2, a reception circuit 42 having an FM demodulator 42-1 and an FSK demodulator 42-2, a control circuit 43, and an antenna switch 45 for selectively applying an output signal from an antenna 44 to the reception circuit 42 and applying an output signal from the transmission circuit 41 to the antenna 44 under the control of the control circuit 43.

The electric vehicle has a storage battery remaining capacity determining circuit 46 comprising a storage battery remaining capacity memory 46-1 for storing the remaining capacity of the storage battery and updating the stored remaining capacity at predetermined intervals based on a discharged quantity of the storage battery upon running of the electric vehicle, and a digital comparator 46-2 for comparing the remaining capacity read from the storage battery remaining capacity memory 46-1 with predetermined first and second thresholds. The storage battery remaining capacity determining circuit 46 transmits an output signal from the digital comparator 46-2 to the control circuit The storage battery remaining capacity memory 46-1 may comprise a memory for reading, at predetermined intervals, the data stored in a present storage battery remaining capacity memory which is updated at all times, and storing the read data as a remaining capacity. The present storage battery remaining capacity memory measures a discharged current of the storage battery and a voltage across the storage battery upon propulsion of the electric vehicle, calculates a consumed quantity of the storage battery based on the measured discharged current and voltage, subtracts the calculated consumed quantity from the storage battery capacity stored in the present storage battery remaining capacity memory, and updates the present storage battery remaining capacity by restoring the differential capacity as the present storage battery remaining capacity. For charging the storage battery, the present storage battery remaining capacity memory calculates a charging quantity based on a charging current of the storage battery, a voltage across the storage battery, and a charging time, adds the calculated charging quantity to the storage battery capacity stored in the present storage battery remaining capacity memory, and updates the present storage battery remaining capacity by restoring the sum capacity as the present storage battery remaining capacity. Therefore, the stored data of the present storage battery remaining capacity memory are updated at all times. The stored data of the present storage battery remaining capacity memory are read at predetermined intervals and stored as a remaining capacity in the storage battery remaining capacity memory 46-1.

The storage battery remaining capacity determining circuit 46 outputs a signal indicative of one of the ranges of the rated capacity of the storage battery to which the remaining capacity in the storage battery belongs as determined by comparison with the first and second thresholds. The signal, i.e., a remaining capacity indication signal corresponding to the determined one of the ranges, is sent to the control circuit 43, which transmits the signal through the transmission circuit 41.

For example, the first threshold is set to a value of 80% of the rated capacity of the storage battery, and the second threshold is set to a value of 20% of the rated capacity of the storage battery. However, the first and second thresholds are not limited to, but may be of other values than, 80% and 20% of the rated capacity of the storage battery.

The electric vehicle also has an air-conditioning unit controller 47 for controlling the air-conditioning unit 48. Based on a start command from the control circuit 43, the air-conditioning unit controller 47 refers to the remaining capacity stored in the storage battery remaining capacity memory 46-1, and, when the remaining capacity is sufficient to be able to energize the air-conditioning unit 48, starts the air-conditioning unit 48 and delivers an operation signal of the air-conditioning unit 48 to the control circuit 43.

The control circuit 43 normally shifts the antenna switch 45 to the reception circuit 42 in order to send an output signal from the antenna 44 based on a transmitted signal from the portable control unit 1. For transmitting a signal, the control circuit 43 shifts the antenna switch 45 to the transmission circuit 41.

A signal received by the reception circuit 42 is FM-demodulated by the FM demodulator 42-1, and an FM-demodulated output signal from the FM demodulator 42-1 is FSK-demodulated by the FSK demodulator 42-2, which supplies an FSK-demodulated output signal to the control circuit 43. In response to the FSK-demodulated output signal, the control circuit 43 carries out a process indicated by the FSK-demodulated output signal. If the FSK-demodulated output signal indicates a request to indicate the remaining capacity of the storage battery, then the control circuit 43 reads a remaining capacity signal based on an output signal from the digital comparator 46-2, sets and resets F, M, and E flags corresponding to the ranges of the remaining capacity in a transmission format employed by the communication unit 2, and shifts the antenna switch 45 to the transmission circuit 41. An output signal indicative to the remaining capacity from the control circuit 43 is FSK-modulated by the FSK modulator 41-1 based on the transmission format employed by the communication unit 2, and an FSK-modulated output signal from the FSK modulator 41-1 is used as a modulation signal to modulate a carrier with the frequency modulator 41-2, whose output signal is transmitted from the antenna 44.

If the FSK-demodulated output signal indicates the starting of the air-conditioning unit 48, then the control circuit 43 controls the air-conditioning unit controller 47 to turn on the air-conditioning unit 48. If the FSK-demodulated output signal indicates the shutdown of the air-conditioning unit 48, then the control circuit 43 controls the air-conditioning unit controller 47 to turn off the air-conditioning unit 48. If the FSK-demodulated output signal indicates the locking of the doors of the electric vehicle, then the control circuit 43 operates a door lock actuator 51 to lock the doors of the electric vehicle. If the FSK-demodulated output signal indicates the unlocking of the doors of the electric vehicle, then the control circuit 43 operates a door unlock actuator 52 to unlock the doors of the electric vehicle.

In FIGS. 1 and 2, a switch 49 serves as a switch for detecting whether the doors are locked or unlocked, and a switch 50 serves as a switch for manually locking and unlocking the doors.

Prior to describing operation of the apparatus 10, transmission data formats will be described below.

FIG. 4A shows a format of transmission data from the portable control unit 1, and FIG. 4B shows a format of transmission data from the communication unit 2.

As shown in FIG. 4A, the transmission data from the portable control unit 1 include 8-bit frame synchronizing data (SYNC), 32-bit identification data (ID1~ID4) assigned to the electric vehicle, 8-bit flag data with each bit corresponding to a control signal, and error-correcting data. The flag data comprises a 1-bit flag for indicating the starting of the air-conditioning unit 48, a 1-bit flag for indicating the shutdown of the air-conditioning unit 48, a 1-bit flag for indicating the locking of the doors, a 1-bit flag for indicating the unlocking of the doors, a 1-bit flag for indicating a request "1", a 1-bit flag for indicating a request "2", and remaining two spare bits. The indication of the request "1" is an indication of a request for an immediate response, and the indication of the request "2" is an indication of a request for a response. The responses to these indications include information as to the remaining capacity of the storage battery.

As shown in FIG. 4B, the transmission data from the communication unit 2 include 8-bit frame synchronizing data (SYNC), 32-bit identification data (ID1~ID4) assigned to the electric vehicle, 8-bit flag data with each bit corresponding to a control signal for indicating the turning-on of the indicator lamp, and error-correcting data. The flag data comprises a 1-bit flag (also referred to as A/C flag) which is set when the air-conditioning unit 48 is in operation, a 1-bit flag F which is set when the remaining capacity of the storage battery is equal to or greater than the first threshold, a 1-bit flag M which is set when the remaining capacity of the storage battery is smaller than the first threshold and equal to or greater than the second threshold, a 1-bit flag E which is set when the remaining capacity of the storage battery is smaller than the second threshold, a 1-bit blink flag which is set when the air-conditioning unit 48 is already in operation at the time a signal for indicating the starting the air-conditioning unit 48 is received, and remaining three spare bits.

Operation of the apparatus 10 will be described below with reference to flowcharts shown in FIGS. 5 through 10, and diagrams shown in FIGS. 11 and 12A~12C.

Figure 5:
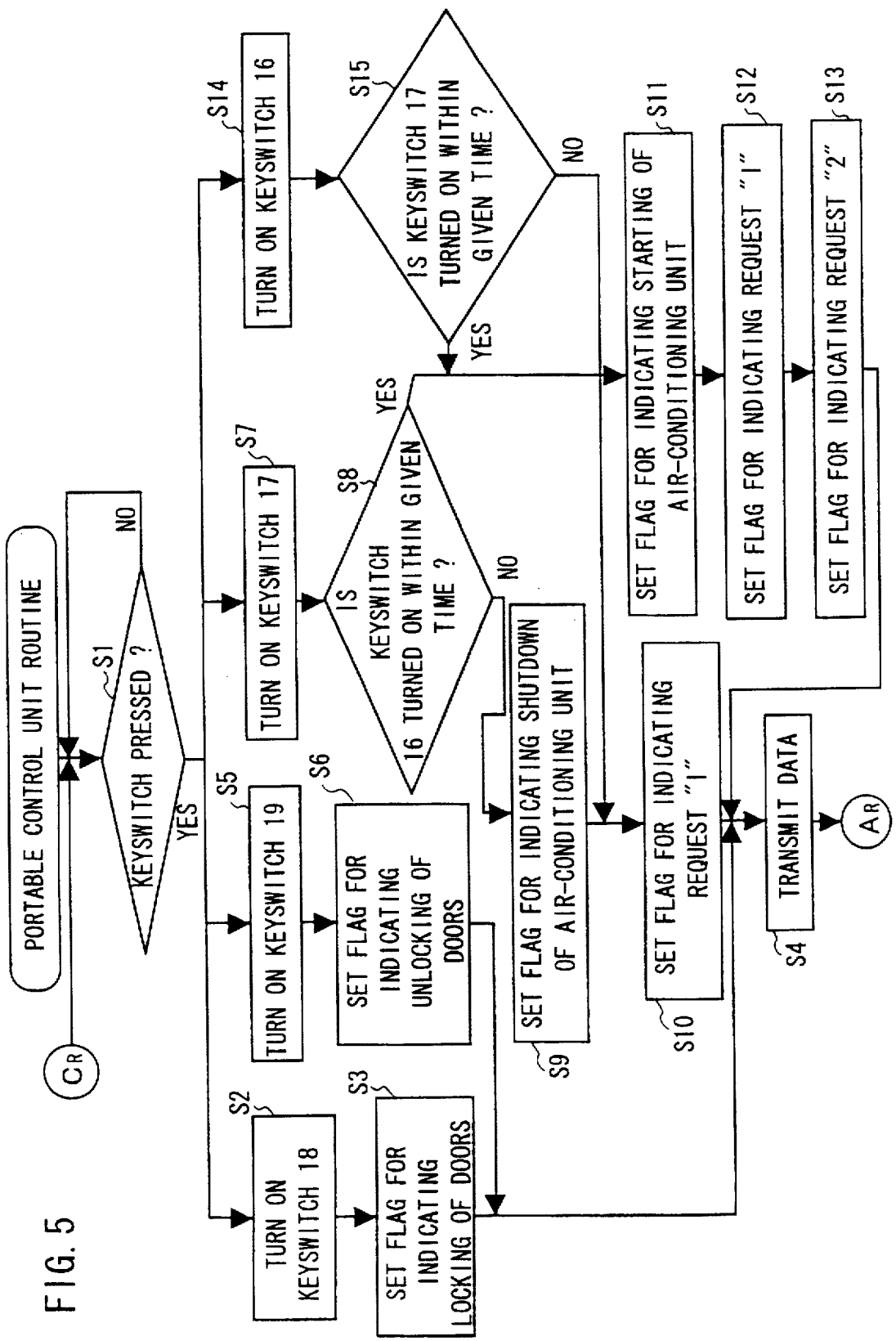
FIGS. 5 through 7 are flowcharts of an operation sequence, carried out by the portable control unit, of the method according to the present invention.
Figure 6:
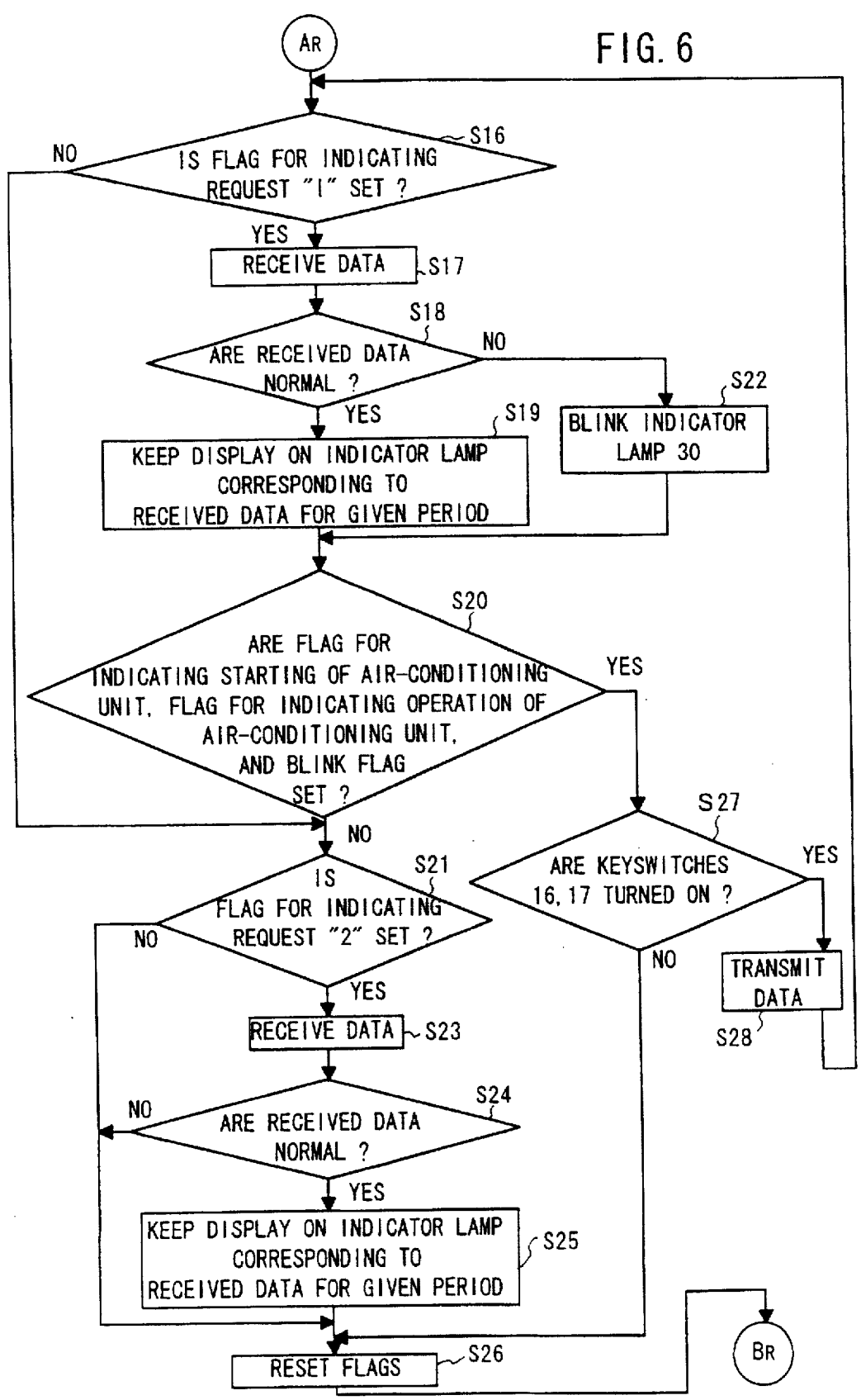
Figure 7:
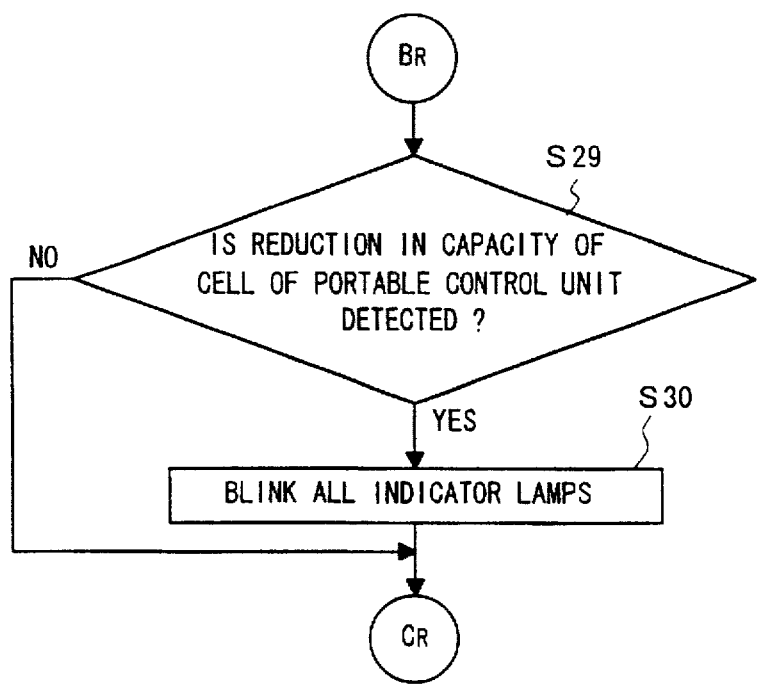

FIGS. 5 through 7 show an operation sequence which is carried out by the portable control unit 1.

A step S1 determines whether the keyswitches 16, 17, 18 and/or 19 is pressed. Specifically, output signals of the keyswitches are scanned, and any keyswitch which is determined as being turned on based on the scanning is detected by the control circuit 13.

If the keyswitch 18 is turned on in a step S2 as determined by the scanning of the output signals from the keyswitches, then the flag for indicating the locking of the doors is set in a step 3, and is transmitted in a step S4. For the transmission in the step S4, the antenna switch 15 is shifted to the transmission circuit 11, the signal is FSK-modulated based on the transmission data format, and the carrier is frequency modulated by the FSK-modulated signal. At this time, a signal based on the frame synchronizing data, the identification data, the error-correcting data, and a signal based on the flag data indicative of the flag for indicating the locking of the doors, which is set by the turning on of the keyswitch 18, is transmitted.

If the keyswitch 19 is turned on in a step S5 as determined by the scanning of the output signals from the keyswitches, then the flag for indicating the unlocking of the doors is set in a step 6, and is transmitted in the step S4. At this time, a signal based on the flag data indicative of the flag for indicating the unlocking of the doors, which is set by the turning on of the keyswitch 18, is transmitted.

If the keyswitch 17 is turned on in a step S7 as determined by the scanning of the output signals from the keyswitches, then it is checked in a step S8 whether the keyswitch 16 is turned on within a predetermined period of time, e.g., 0.3 second, from the step S7. If the keyswitch 16 is not turned on in the step S8, then since only the keyswitch 17 is turned on, and the flag for indicating the shutdown of the air-conditioning unit 48 is set in a step S9, the flag for indicating the request "1" is set in a step S10, and then data are transmitted in the step S4. After the steps S7, S8, S9, and S10, a signal based on the frame synchronizing data, the identification data, the error-correcting data, flag data indicating that the flag for indicating the shutdown of the air-conditioning unit 48 and the flag for indicating the request "1" are set is transmitted.

If the keyswitch 16 is turned on in the step S8, then since the keyswitches 16, 17 are turned on, indicating the starting of the air-conditioning unit 48, the flag for indicating the starting of the air-conditioning unit 48 is set in a step S11, the flag for indicating the request "1" is set in a step S12, the flag for indicating the request "2" is set in a step S13, and then data are transmitted in the step S4. After the steps S7, S8, S11 through 13, a signal based on the frame synchronizing data, the identification data, the error-correcting data, flag data indicating that the flag for indicating the shutdown of the air-conditioning unit 48, the flag for indicating the request "1", and the flag for indicating the request "2" are set is transmitted.

If the keyswitch 16 is turned on in a step S14 as determined by the scanning of the output signals from the keyswitches, then it is checked in a step S15 whether the keyswitch 17 is turned on within a predetermined period of time, e.g., 0.3 second, from the step S14. If the keyswitch 17 is turned on in the step S15, indicating the starting of the air-conditioning unit 48, then control goes to the step S11. Specifically, the flag for indicating the starting of the air-conditioning unit 48 is set in the step S12, the flag for indicating the request "1" is set in the step S12, the flag for indicating the request "2" is set in the step S13, and then data are transmitted in the step S4. After the steps S15, S11 through 13, a signal based on the frame synchronizing data, the identification data, the error-correcting data, flag data indicating that the flag for indicating the shutdown of the air-conditioning unit 48, the flag for indicating the request "1" , and the flag for indicating the request "2" are set is transmitted.

If the keyswitch 17 is not turned on in the step S15, then control goes to the step S10. Specifically, since only the keyswitch 16 is turned on, indicating the display of the remaining capacity of the storage battery, the flag for indicating the request "1" is set in the step S10 and then data are transmitted in the step S4 to indicate only the display of the remaining capacity of the storage battery.

The steps S7, S8, S14, and S15 are steps for checking the states of the keyswitches. If the keyswitches 16, 17 are turned on one after another within 0.3 second, then they are regarded as being turned on simultaneously with each other.

As described above, the responses to the indications for the request "1" and the request "2" include information as to the remaining capacity of the storage battery. Therefore, when the keyswitch 16 and/or the keyswitch 17 is turned on, a signal including information about the remaining capacity of the storage battery is returned from the communication unit 2.

In the above example, when the keyswitches 18, 19 are turned on, the flag for indicating the request "1" or the flag for indicating the request "2" is not set. Therefore, when the locking of the doors and the unlocking of the doors are indicated, a signal including information about the remaining capacity of the storage battery is not returned from the communication unit 2. However, a step of setting the flag for indicating the request "1" may be added between the steps S3, S4 and also between the steps S6, S4 to return a signal including information about the remaining capacity of the storage battery from the communication unit 2 when the keyswitches 16, 17 are turned on, i.e., when the locking of the doors and the unlocking of the doors are indicated.

After the signal is transmitted in the step S4, it is determined in a step S16 whether flag data indicating that the flag for indicating the request "1" is set are transmitted or not. If flag data indicating that the flag for indicating the request "1" is set are transmitted, then the antenna switch 15 is shifted to the reception circuit 12, waiting for a transmitted signal from the communicating unit 2 in a step S17.

If flag data indicating that the flag for indicating the request "1" is set are not transmitted in the step S16, then it is determined in a step S21 whether flag data indicating that the flag for indicating the request "2" is set are transmitted or not. If flag data indicating that the flag for indicating the request "1" is set are transmitted, then the antenna switch 15 is shifted to the reception circuit 12, waiting for a transmitted signal from the communicating unit 2 in a step S23.

If flag data indicating that the flag for indicating the request "2" is set are not transmitted in the step 21, then all the flags are reset in a step S26. Thereafter, it is determined in a step S29 whether the capacity of a lithium cell for energizing the portable control unit 1 has dropped below a rated capacity thereof or not. If not, then control goes back to the step S1. If dropped, then all the indicator lamps 20-1, 20-2, 20-3 are blinked in a step S30, indicating that the capacity of the lithium cell has dropped. Thereafter, control returns to the step S1.

Figure 8:
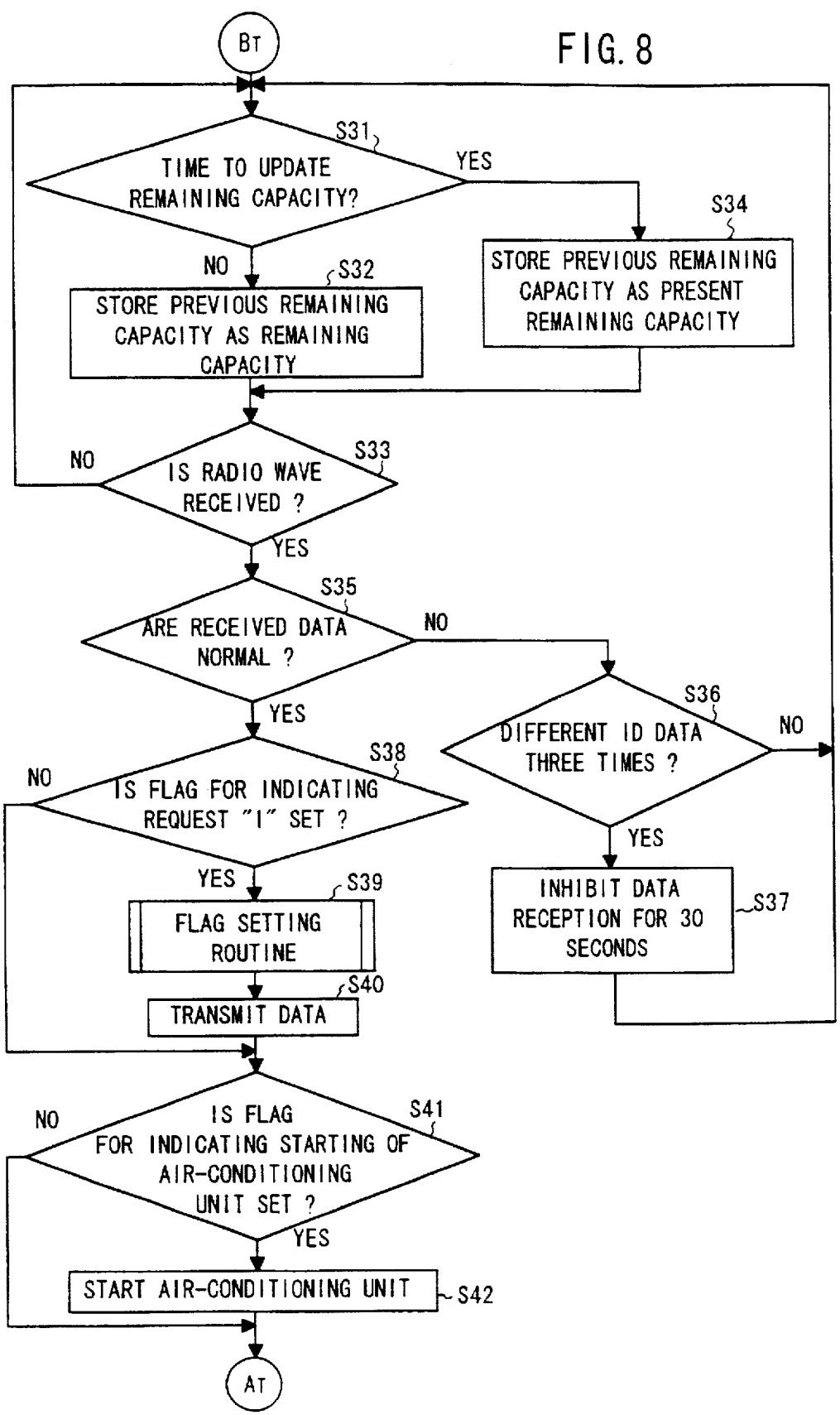
FIGS. 8 through 10 are flowcharts of an operation sequence, carried out by the communication unit, of the method according to the present invention.
Figure 9:
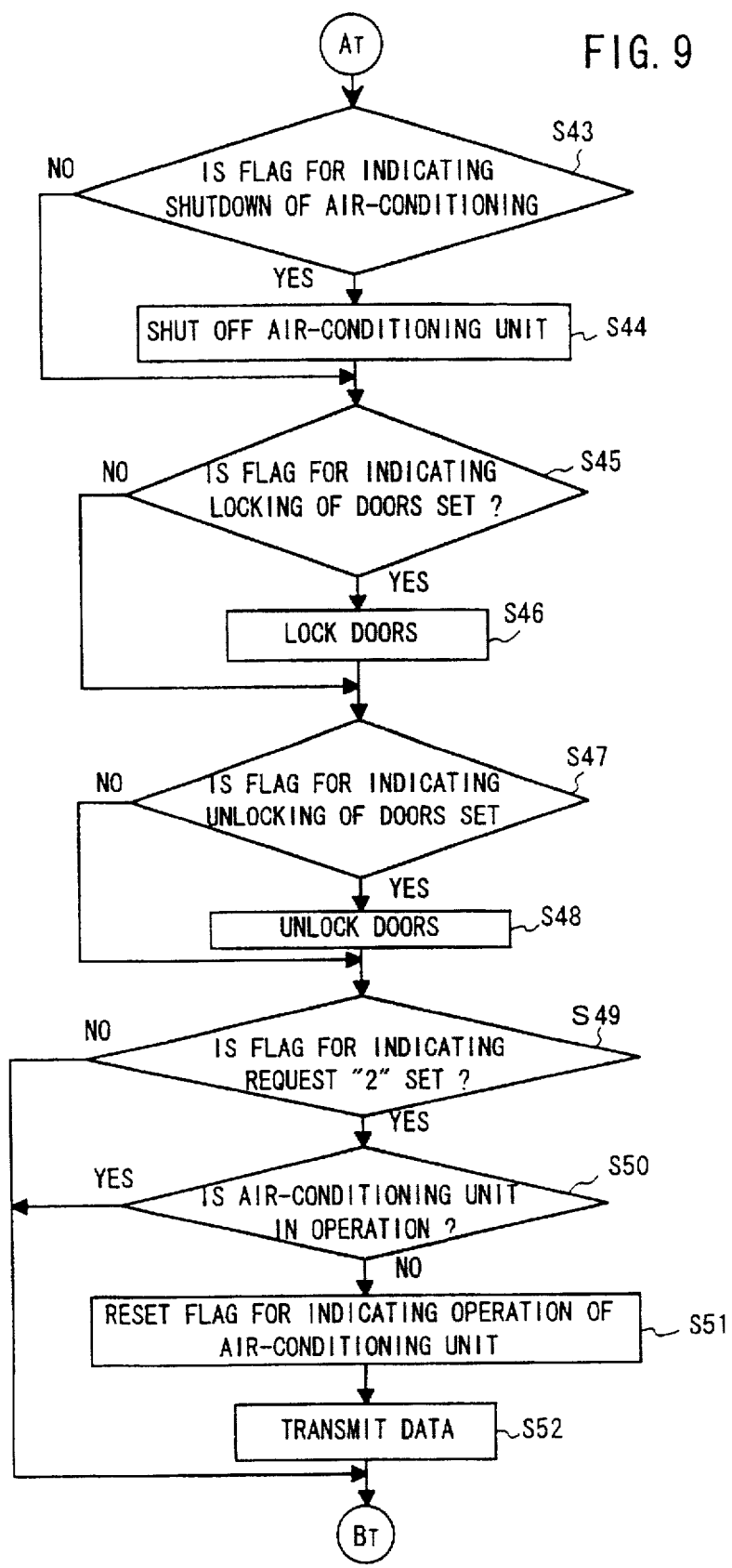
Figure 10:
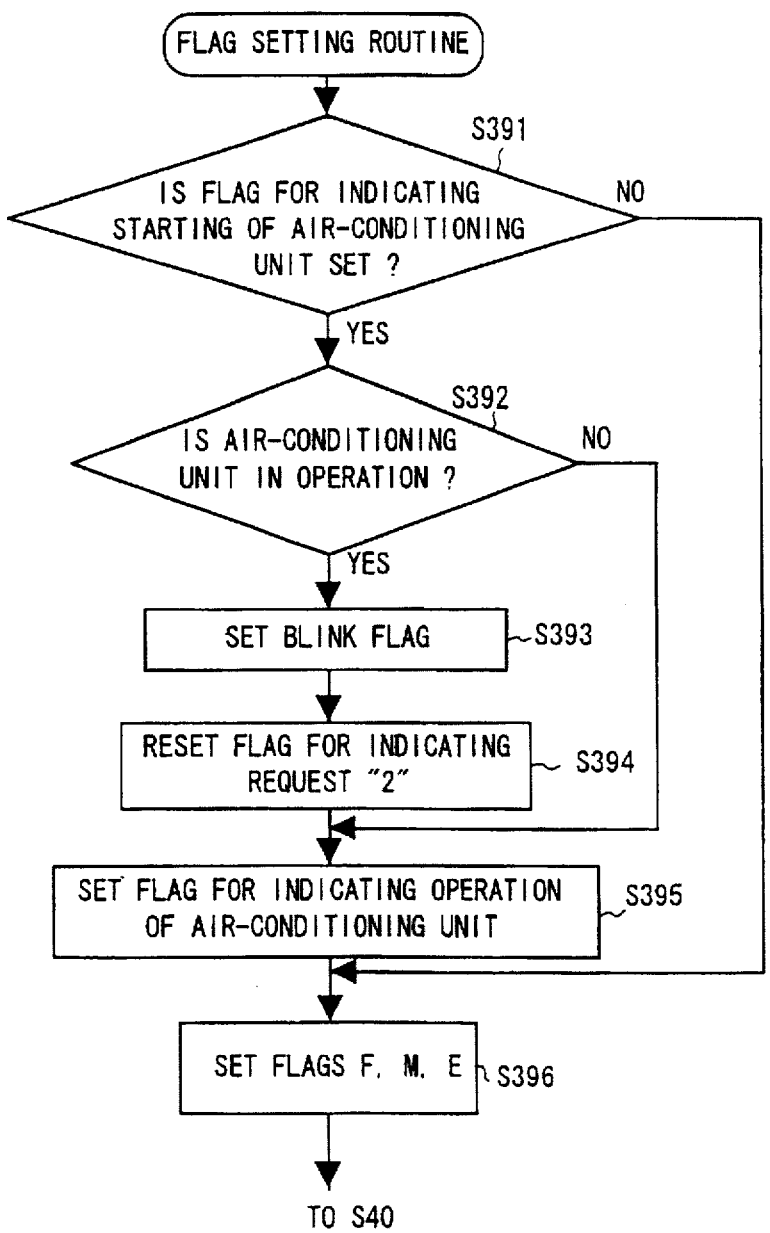

FIGS. 8 through 10 show an operation sequence which is carried out by the communication unit 2.

After previous updating of the data stored in the storage battery remaining capacity memory 46-1, it is determined in a step S31 whether the time for updating the data stored in the storage battery remaining capacity memory 46-1 has been reached or not. Since the remaining capacity of the storage battery is updated at predetermined intervals, as described above, it is checked whether the updating time has been reached or not in the step S31. If the updating time has not been reached, then the previous remaining capacity is stored in the storage battery remaining capacity memory 46-1 in a step S32, and it is determined in a step S33 whether a radio wave from the portable control unit 1 has been received or not. If the updating time has been reached in the step S31, the remaining capacity is updated and stored as a present remaining capacity in a step S34. Then, control goes to the step S33.

The steps S31 through S34 are repeated until a radio wave from the portable control unit 1 is received in the step S33.

The FM radio wave transmitted from the portable control unit 1 is received by the communication unit 2 which is tuned to the carrier frequency of the FM radio wave. If the FM radio wave from the portable control unit 1 is received by the communication unit 2 in the step S33, the received signal is FM-demodulated, and the FM-demodulated signal is FSK-demodulated into received data having the transmission data format transmitted from the portable control unit 1. If the received data contain an error, it is corrected in cooperation with error-correcting data. It is determined in a step S35 whether the error-corrected data are normal or not by checking whether identification data in the received data are the same as the identification data assigned to the electric vehicle on which the communication unit 2 is installed. If the identification data in the received data are not the same as the identification data assigned to the electric vehicle, then it is checked in a step S36 whether the identification data are different from the identification data assigned to the electric vehicle three successive times.

If the identification data are not different from the identification data assigned to the electric vehicle three successive times, then control returns to the step S31. If the identification data are different from the identification data assigned to the electric vehicle three successive times, then the reception of data is inhibited for a predetermined period of time, e.g., 30 seconds, in a step S37. Then, control returns to the step S31.

The steps S36, S37 serve to prevent the reception of false data. If different identification data are received three successive times, then the reception of all data is inhibited for 30 seconds.

If the received data are normal in the step S35, it is checked in a step S38 whether the flat for indicating the request "1" in the received data is set or not. If the flat for indicating the request "1" is set, then a flag setting routine is executed in a step S39.

As shown in FIG. 10, the flag setting routine first checks whether the flag for indicating the starting of the air-conditioning unit 48 in the received data is set or not in a step S391. If the flag for indicating the starting of the air-conditioning unit 48 is set, then it is determined in a step S392 whether 10 seconds or more have elapsed after the air-conditioning unit 48 has been turned on, i.e., whether the air-conditioning unit 48 is already in operation, or not.

If the air-conditioning unit 48 is already in operation, then the blink flag is set in a step S393, and thereafter the flag for indicating the request "2" in the received data is reset in a step S394.

After the step S394, the flag for indicating that the air-conditioning unit 48 is in operation is set in a step S395. Thereafter, the flag F, M, or E corresponding to the output signal from the digital comparator 46-2 based on the remaining capacity stored in the storage battery remaining capacity memory 46-1 is set in a step S396. Subsequently, control goes to a step S40. In the step S396, the flag F is set and the flags M, E are reset when the remaining capacity is equal to or greater than the first threshold, the flag M is set and the flags F, E are reset when the remaining capacity is smaller than the first threshold and equal to or greater than the second threshold, and the flag E is set and the flags F, M are reset when the remaining capacity is smaller than the second threshold.

If the air-conditioning unit 48 is not in operation in the step S392, then control skips the steps S393, S394 and goes to the step S395. Since the flag for indicating the starting of the air-conditioning unit 48 in the received data is set in the step S391, the flag for indicating that the air-conditioning unit 48 in operation is set in the step S395, allowing the air-conditioning unit 48 to be started in a subsequent step S42. If the flag for indicating the starting of the air-conditioning unit 48 in the received data is not set in the step S391, then control skips the steps S392-S395, and goes to the step S396.

After the flag setting routine in the step S39, the antenna switch 45 is shifted to the transmission circuit 41, a signal is FSK-modulated based on the frame synchronizing data, the identification data, the flag data established in the flag setting routine (in the step S39), and the error-correcting data, and a carrier is frequency modulated by the FSK-modulated signal and transmitted in the step S40. Therefore, when the flag for indicating the request "1" is set in the received data, the flags are quickly set and transmitted If the flag for indicating the request "1" is set in the received data in the step S38, then it is determined in a step S41 whether the flag for indicating the starting of the air-conditioning unit 48 in the received data is set or not. If the flag for indicating the starting of the air-conditioning unit 48 is set, then the air-conditioning unit 48 is started in the step S42. For starting the air-conditioning unit 48, the air-conditioning unit controller 47 sends a start request signal to check if the air-conditioning unit 48 can be started or not, to the storage battery remaining capacity determining circuit 46, which refers to the remaining capacity stored in the storage battery remaining capacity memory 46-1. If the remaining capacity is sufficient to be able to start the air-conditioning unit 48, then the storage battery remaining capacity determining circuit 46 issues a permission signal. In response to the permission signal, the air-conditioning unit controller 47 starts the air-conditioning unit 48, and supplies an air-conditioning unit operation signal to the control circuit 43.

After the step S42, it is determined in a step S43 whether the flag for indicating the shutdown of the air-conditioning unit 48 is set or not. If the flag for indicating the shutdown of the air-conditioning unit 48 is set, the air-conditioning unit 48 is shut off in a step S44.

If the flag for indicating the starting of the air-conditioning unit 48 is not set in the step S41, then control jumps to the step S43.

After the step S44, it is determined in a step S45 whether the flag for indicating the locking of the doors in the received data is set or not. If the flag for indicating the locking of the doors is set, then the door lock actuator 51 is operated to lock the doors in a step S46. If the flag for indicating the shutdown of the air-conditioning unit 48 is not set in the step S43, then control jumps to the step S45.

After the step S46, it is determined in a step S47 whether the flag for indicating the unlocking of the doors in the received data is set or not. If the flag for indicating the unlocking of the doors is set, then the door unlock actuator 52 is operated to unlock the doors in a step S48. If the flag for indicating the locking of the doors is not set in the step S45, then control jumps to the step S47.

After the step S48, it is determined in a step S49 whether the flag for indicating the request "2" in the received data is set or not. If the flag for indicating the request "2" is set, then it is checked in a step S50 whether the air-conditioning unit 48 is in operation or not. If the air-conditioning unit 48 is not in operation, then the flag for indicating that the air-conditioning unit 48 is in operation is reset in a step S51. The air-conditioning unit 48 is controlled to operate, the flag F, M, or E corresponding to the output signal from the digital comparator 46-2 based on the remaining capacity stored in the storage battery remaining capacity memory 46-1 is set, and a signal indicating that the air-conditioning unit 48 is in operation is confirmed, and transmitted through the transmission circuit 41 in a step S52. Control then returns from the step S52 to the step S31.

In the step S51, the flag F is set and the flags M, E are reset when the remaining capacity is equal to or greater than the first threshold, the flag M is set and the flags F, E are reset when the remaining capacity is smaller than the first threshold and equal to or greater than the second threshold, and the flag E is set and the flags F, M are reset when the remaining capacity is smaller than the second threshold, as with the step S396. For the transmission in the step S52, the antenna switch 45 is shifted to the transmission circuit 41, a signal is FSK-modulated based on the frame synchronizing data, the identification data, the established flag data, and the error-correcting data, and a carrier is frequency modulated by the FSK-modulated signal and transmitted in the same manner as described above.

If the flag for indicating the request "2" is not set in the step S49, control returns from the step S49 to the step S31. If the air-conditioning unit 48 is in operation in the step S50, control returns from the step S50 to the step S31.

Operation of the portable control unit 1 which has received a radio wave from the communication unit 2 will be described below with reference to FIGS. 6 and 7.

If a radio wave from the communication unit 2 is received in the step S17, a signal based on the received radio wave is FM-demodulated, and an FM-demodulated signal is FSK-demodulated into received data having the transmission data format transmitted from the communication unit 2. If the received data contain an error, it is corrected in cooperation with error-correcting data. It is determined in a step S18 whether the error-corrected data are normal or not by checking whether identification data in the received data are the same as the identification data assigned to the portable control unit 1 in association with the electric vehicle on which the communication unit 2 is installed. If the received data are not normal in the step S18, then the indicator lamp 30 is blinked, indicating that the received data are not normal in a step S22. If the received data are normal in the step S18, then the indicator lamp 20-1, 20-2, or 20-3 corresponding to the flag data in the received data is turned on or blinked for a predetermined period of time in a step S19. In the step S19, the indicator lamp 20-1, 20-2, or 20-3 corresponding to the flag data (the flag F, M, or E) in the received data is turned on if the blink flag is reset, and the indicator lamp 20-1, 20-2, or 20-3 corresponding to the flag data (the flag F, M, or E) in the received data is blinked if the blink flag is set for a predetermined period of time. When an indication is given to start the air-conditioning unit 48 while the air-conditioning unit 48 is in operation, the blink flag is set, and the indicator lamp 30 is blinked, indicating the operation of the air-conditioning unit 48. If the flag for indicating that the air-conditioning unit 48 is in operation is set, the indicator lamp 30 is turned on in the step S19. If the flag F is set, i.e., if the remaining capacity of the storage battery is 80% or more of the rated capacity thereof, then the indicator lamp 20-1 is either turned on or blinked as shown hatched in FIG. 12A. If the flag M is set, i.e., if the remaining capacity of the storage battery is less than 80% of and 20% or more of the rated capacity thereof, then the indicator lamp 20-2 is either turned on or blinked as shown hatched in FIG. 12B. If the flag E is set, i.e., if the remaining capacity of the storage battery is less than 20% of the rated capacity thereof, the indicator lamp 20-3 is either turned on or blinked as shown hatched in FIG. 12C.

After the steps S19, S22, it is determined in a step S20 whether the flag for indicating that the air-conditioning unit 48 and the blink flag in the received flag data and the flag for indicating the starting of the air-conditioning unit 48 in the flag data of the portable control unit 1 are set or not. The step S20 checks if the starting of the air-conditioning unit 48 is indicated, and, also checks if the air-conditioning unit 48 is already in operation or not when the starting of the air-conditioning unit 48 is indicated.

If the starting of the air-conditioning unit 48 is indicated and also the air-conditioning unit 48 is already in operation when the starting of the air-conditioning unit 48 is indicated, then it is determined in a step S27 whether both the keyswitches 16, 17 are turned on or not. When the step S27 is executed, since the blink flag has been set, the indicator lamp 30 which has been turned on is blinked, and the checking of the step S27 is carried out while the indicator lamp is being blinked. If both the keyswitches 16, 17 are turned on, then it confirms that the air-conditioning unit 48 which has already been in operation will be continuously operated for an extended period of time. The flag for indicating the starting of the air-conditioning unit 48 is set, and a signal is transmitted through the transmission circuit 11 in a step S28. Thereafter, control returns to the step S16.

If both the keyswitches 16, 17 are not turned on in the step S27, then all the flags are reset in the step S26. Control goes to the step S29, and an instruction in response to the turning-on of a next keyswitch is awaited.

If at least one of the flags for indicating that the air-conditioning unit 48 and the blink flag in the received flag data and the flag for indicating the starting of the air-conditioning unit 48 in the flag data of the portable control unit 1 is not set in the step S20, then it is determined in a step S21 whether the flag for indicating the request "2" is set or not. If the flag for indicating the request "2" is not set, control jumps to the step S26.

If the flag for indicating the request "2" is set in the step S21, then the reception of a radio wave from the communication unit 2 is awaited. When a radio wave from the communication unit 2 is received, the received signal is FM-demodulated, and the FM-demodulated signal is FSK-demodulated into received data having the transmission data format transmitted from the communication unit 2. If the received data contain an error, it is corrected in cooperation with error-correcting data in a step S23.

It is determined in a step S24 whether the error-corrected data are normal or not by checking identification data in the received data are the same as the identification data assigned to the portable control unit 1 in association with the electric vehicle on which the communication unit 2 is installed.

If the received data are normal in the step S24, then the indicator lamp 20-1, 20-2, or 20-3 corresponding to the flag data in the received data is turned on or blinked continuously for a predetermined period of time in a step S25 in the same manner as with the step S19. Then, control goes to the step S26. If the received data are not normal in the step S24, then control jumps from the step S24 to the step S26.

As described above, the indicator lamp 20-1, 20-2, or 20-3 is turned on or blinked based a control signal corresponding to the flag data set on the basis of the remaining capacity of the storage battery which has been transmitted from the communication unit 2.

In the illustrated embodiment, a signal transmitted from the communication unit 2 for displaying the remaining capacity of the storage battery takes a very short period of time for communications, and does not impose limitations on the interval between keyswitch operations.

While the first and second thresholds are employed in the illustrated embodiment, the number of thresholds used may be increased insofar as they do not impose limitations on the interval between keyswitch operations, for indicating the remaining capacity of the storage battery in a greater number of ranges.

In the method according to the present invention, as described above, since the time required to transmit signals to indicate the remaining capacity of the storage battery between the portable control unit 1 and the communication unit 2 is very short, it does not impose limitations on the interval between keyswitch operations when the keyswitches are to be pressed frequently.

Since the number of indicator lamps can be reduced, the portable control unit 1 may be reduced in size. Only when a display request signal is transmitted, one of the indicator lamps which corresponds to the remaining capacity of the storage battery is turned on for a predetermined period of time. Therefore, the consumption of electric energy by the portable control unit can be reduced.

Although a certain preferred embodiment of the present invention has been shown and described in detail, it should be understood that various changes and modifications may be made therein without departing from the scope of the appended claims.

What is claimed is:

1. A method of transmitting and receiving a signal indicative of the remaining capacity of a storage battery for propelling an electric vehicle, comprising the steps of:

transmitting a display request signal for displaying the remaining capacity of the storage battery from a portable control unit which has a plurality of indicator lamps corresponding to respective ranges of a rated capacity of the storage battery, to a communication unit on the electric vehicle;

receiving the display request signal with the communication unit;

determining one of said ranges to which the remaining capacity of the storage battery belongs, with the communication unit;

transmitting a remaining capacity display signal representing the determined range from the communication unit to the portable control unit;

receiving the remaining capacity display signal with the portable control unit;

determining whether the signal received by said portable control unit is normal or not; and turning on one of the indicator lamps which corresponds to the range to which the remaining capacity of the storage battery belongs, based on the received remaining capacity display signal if the received signal is normal, and blinking a predetermined indicator map if the received signal is not normal.

2. A method according to claim 1, wherein said portable control unit has remote control means for controlling a device on the electric vehicle and transmitting a remote control signal, said display request signal doubling as said remote control signal.

3. A method according to claim 1, wherein signals transmitted between said portable control unit and said communication unit comprise frequency-shift keying modulated signals.

4. A method according to claim 1, wherein said portable control unit has a backup cell, further comprising the step of blinking all the indicator lamps of said portable control unit when the remaining capacity of said backup cell is smaller than a predetermined value.

5. A method according to claim 1, further comprising the step of switching the portable control unit to a reception mode when the display request signal is transmitted from the portable control unit.

6. A method according to claim 1, wherein the signal transmitted from the portable control unit includes a predetermined identification signal corresponding to the electric vehicle.

7. A method according to claim 6, further comprising the step of inhibiting the communication unit from receiving any signal for a predetermined period of time when the identification signal included in the signal transmitted from the portable control unit and received by the communication unit does not agree with a predetermined identification signal assigned to the electric vehicle for a predetermined number of times.

8. A method according to claim 2, wherein said remote control means includes means for indicating the shutdown of an air-conditioning unit on the electric vehicle.

9. A method according to claim 8, further comprising the step of starting the air-conditioning unit only when the remaining capacity of the storage battery is at least a predetermined value when the starting of the air-conditioning unit is indicated and a signal including a starting indication signal for the starting of the air-conditioning conditioning unit is received by the communication unit.

10. A method of transmitting and receiving a signal indicative of the remaining capacity of a storage battery for propelling an electric vehicle, comprising the steps of:

transmitting a display request signal for displaying the remaining capacity of the storage battery from a portable control unit which has a plurality of indicator lamps corresponding to respective ranges of a rated capacity of the storage battery, to a communication unit on the electric vehicle;

switching the portable control unit to a reception mode when the display request signal is transmitted from the portable control unit;

receiving the display request signal with the communication unit;

determining one of said ranges to which the remaining capacity of the storage battery belongs, with the communication unit;

transmitting a remaining capacity display signal representing the determined range from the communication unit to the portable control unit;

receiving the remaining capacity display signal with the portable control unit; and turning on one of the indicator lamps which corresponds to the range to which the remaining capacity of the storage battery belongs, based on the received remaining capacity display signal, for a predetermined period of time.

11. A method according to claim 10, wherein said portable control unit has remote control means for controlling a device on the electric vehicle and transmitting a remote control signal, said display request signal doubling as said remote control signal.

12. A method according to claim 10, wherein signals transmitted between said portable control unit and said communication unit comprise frequency-shift keying modulated signals.

13. A method according to claim 10, wherein said portable control unit has a backup cell, further comprising the step of blinking all the indicator lamps of said portable control unit when the capacity of said backup cell is smaller than a predetermined value.

14. A method according to claim 10, wherein the signal transmitted from the portable control unit includes a predetermined identification signal corresponding to the electric vehicle.

15. A method according to claim 14, further comprising the step of inhibiting the communication unit from receiving any signal for a predetermined period of time when the identification signal included in the signal transmitted from the portable control unit and received by there communication unit does not agree with a predetermined identification signal assigned to the electric vehicle for a predetermined number of times.

16. A method according to claim 11, wherein said remote control means includes means for indicating the shutdown of an air-conditioning unit on the electric vehicle.

17. A method according to claim 16, further comprising the step of starting the air-conditioning unit only when the remaining capacity of the storage battery is at least a predetermined value when the starting of the air-conditioning unit is indicated and a signal including a starting indication signal for the starting of the air-conditioning unit is received by the communication unit.

\* \* \* \* \*